(12) United States Patent
Haba et al.

(10) Patent No.: US 8,787,032 B2
(45) Date of Patent: Jul. 22, 2014

(54) ENHANCED STACKED MICROELECTRONIC ASSEMBLIES WITH CENTRAL CONTACTS

(75) Inventors: Belgacem Haba, Saratoga, CA (US); Wael Zohni, San Jose, CA (US); Richard Dewitt Crisp, Hornitos, CA (US)

(73) Assignee: Tessera, Inc., San Jose, CA (US)

( * ) Notice: Subject to any disclaimer, the term of this patent is extended or adjusted under 35 U.S.C. 154(b) by 435 days.

(21) Appl. No.: 13/080,876

(22) Filed: Apr. 6, 2011

(65) Prior Publication Data

US 2012/0155049 A1    Jun. 21, 2012

(30) Foreign Application Priority Data

Dec. 17, 2010    (KR) .................. 10-2010-0129890

(51) Int. Cl.
   *H05K 1/11*    (2006.01)
(52) U.S. Cl.
   USPC .......................................... 361/803; 361/807
(58) Field of Classification Search
   USPC .......... 361/803, 770, 772, 790, 807; 257/691, 257/692, 723, 778, 789
   See application file for complete search history.

(56) References Cited

U.S. PATENT DOCUMENTS

| | | | |
|---|---|---|---|
| 5,148,265 | A | 9/1992 | Khandros et al. |
| 5,148,266 | A | 9/1992 | Khandros et al. |
| 5,679,977 | A | 10/1997 | Khandros et al. |
| 6,385,049 | B1 | 5/2002 | Chia-Yu et al. |
| 6,414,396 | B1 | 7/2002 | Shim et al. |
| 6,445,594 | B1 | 9/2002 | Nakagawa et al. |
| 6,583,502 | B2 | 6/2003 | Lee et al. |
| 6,619,973 | B2 | 9/2003 | Perino et al. |
| 6,703,713 | B1 | 3/2004 | Tseng et al. |
| 6,811,580 | B1 | 11/2004 | Littecke |
| 7,095,104 | B2 | 8/2006 | Blackshear |

(Continued)

FOREIGN PATENT DOCUMENTS

| | | |
|---|---|---|
| JP | 2005251957 A | 9/2005 |
| KR | 2001-0081922 A | 8/2001 |

(Continued)

OTHER PUBLICATIONS

Office Action from Korean Patent Application No. 10-2010-0129890 dated Jan. 18, 2011.

(Continued)

*Primary Examiner* — Tremesha S Willis
(74) *Attorney, Agent, or Firm* — Lerner, David, Littenberg, Krumholz & Mentlik, LLP

(57) ABSTRACT

A microelectronic assembly includes a dielectric element having first and second surfaces, first and second apertures extending between the first and second surfaces and defining a central region of the first surface between the first and second apertures, first and second microelectronic elements, and leads extending from contacts exposed at respective front surfaces of the first and second microelectronic elements to central terminals exposed at the central region. The front surface of the first microelectronic element can face the second surface of the dielectric element. The front surface of the second microelectronic element can face a rear surface of the first microelectronic element. The contacts of the second microelectronic element can project beyond an edge of the first microelectronic element. At least first and second ones of the leads can electrically interconnect a first central terminal of the central terminals with each of the first and second microelectronic elements.

12 Claims, 10 Drawing Sheets

(56) References Cited

U.S. PATENT DOCUMENTS

| | | |
|---|---|---|
| 2002/0053727 A1 | 5/2002 | Kimura |
| 2005/0116358 A1* | 6/2005 | Haba .............................. 257/789 |
| 2005/0258538 A1 | 11/2005 | Gerber |
| 2006/0290005 A1 | 12/2006 | Thomas et al. |
| 2007/0120238 A1 | 5/2007 | Vaiyapuri |
| 2008/0036067 A1 | 2/2008 | Lin |
| 2008/0048777 A1 | 2/2008 | Kohjiro et al. |
| 2008/0136006 A1 | 6/2008 | Jang et al. |
| 2010/0090326 A1 | 4/2010 | Baek et al. |
| 2010/0295166 A1 | 11/2010 | Kim |

FOREIGN PATENT DOCUMENTS

| | | |
|---|---|---|
| KR | 2006-0120365 A | 11/2006 |
| KR | 10-0690247 B1 | 2/2007 |
| KR | 2010-0041430 A | 4/2010 |

OTHER PUBLICATIONS

Search Report from Korean Patent Application No. 10-2010-0129890 dated Jan. 18, 2011.

Partial International Search Report Application No. PCT/US2011/031391, dated Aug. 25, 2011.

International Search Report Application No. PCT/US2011/031391, dated Dec. 12, 2011.

Asinash Roy et al: "Effects of Coupling Capacitance and Inductance on Delay Uncertainty and Clock Skew", 2007 44th ACM/IEEE Design Automation Conference , San Diego, CA, Jun. 4-8, 2007, IEEE, PI Scataway, NJ , Jun. 1, 2007, pp. 184-187, XP031183328.

Kang, et al., 8Gb 3D DDR3 DRAM Using Through-Silicon-Via Technology, IEEE, International Solid-State Circuits Conference, 2009, Samsung Electronics, Hwasung, Korea.

\* cited by examiner

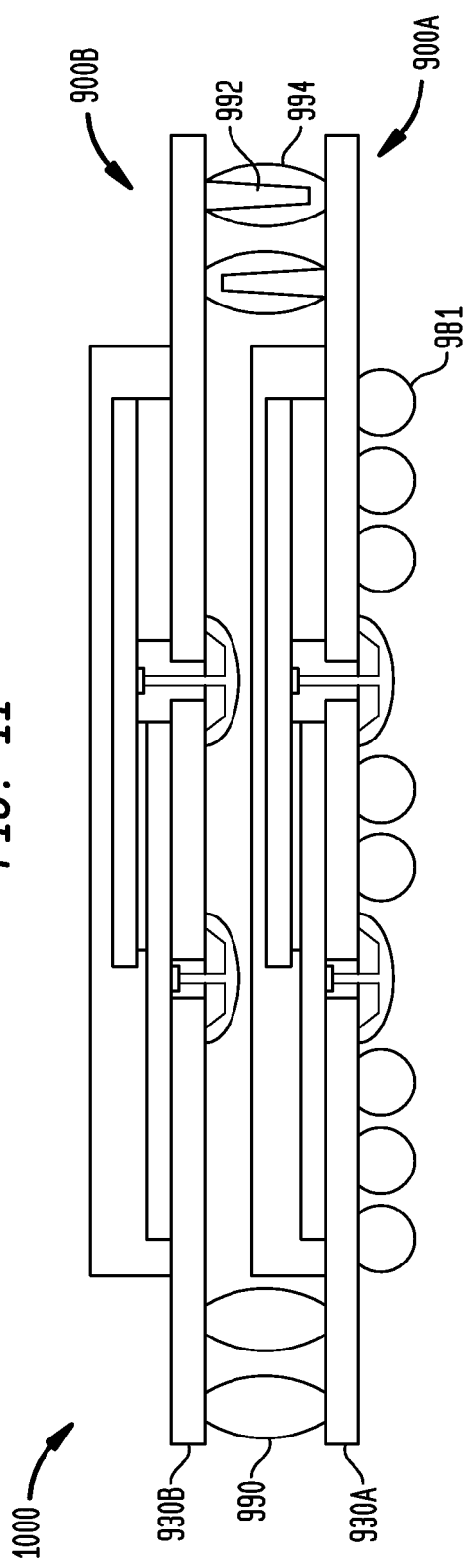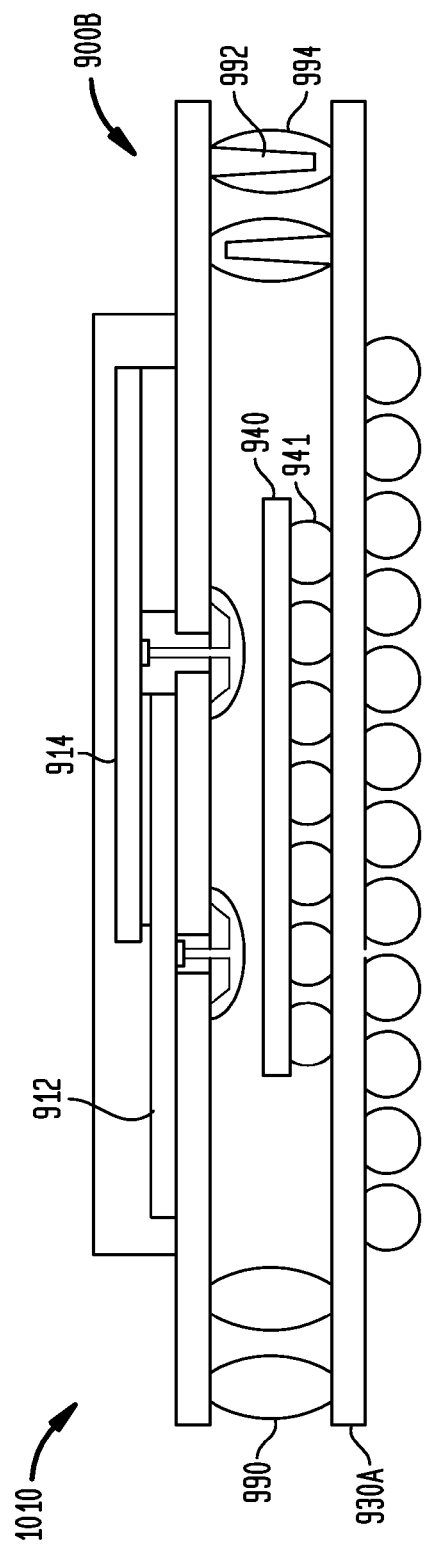

ENHANCED STACKED MICROELECTRONIC ASSEMBLIES WITH CENTRAL CONTACTS

CROSS-REFERENCE TO RELATED APPLICATIONS

The present application claims the benefit of the Korean Patent Application Serial No. 10-2010-0129890, filed Dec. 17, 2010, the disclosure of which is hereby incorporated herein by reference.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself. As used in this disclosure with reference to a flat chip having a front face, the "area of the chip" should be understood as referring to the area of the front face. In "flip chip" designs, the front face of the chip confronts the face of a package substrate, i.e., chip carrier and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus producing the overall size of the product incorporating the circuit panel. Various proposals have been advanced for providing plural chips in a single package or module. In the conventional "multi-chip module," the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite these efforts in the art, further improvements would be desirable in the case of multi-chip packages for chips having contacts located substantially in central regions of the chips. Certain semiconductor chips, such as some memory chips, are commonly made with the contacts in one or two rows located substantially along a central axis of the chip.

BRIEF SUMMARY OF TEE INVENTION

In accordance with an aspect of the invention, a microelectronic assembly can include a dielectric element, a first microelectronic element, a second microelectronic element, and leads extending from contacts of the first and second microelectronic elements to terminals of the dielectric element. The dielectric element can have a first surface, a second surface, first and second apertures extending between the first and second surfaces and defining a central region of the first surface between the first and second apertures, the dielectric element further having electrically conductive elements thereon including central terminals exposed at the central region. The first microelectronic element can have a rear surface and a front surface facing the second surface of the dielectric element, the first microelectronic element having a plurality of contacts exposed at the front surface thereof. The second microelectronic element can have a front surface facing the rear surface of the first microelectronic element, the second microelectronic element having a plurality of contacts exposed at the front surface thereof projecting beyond an edge of the first microelectronic element. The leads can extend from the contacts of the first and second microelectronic elements to the terminals, at least first and second leads thereof electrically interconnecting a first central terminal of the central terminals with each of the first and second microelectronic elements. The first and second leads can be usable to carry at least one of a signal or a reference potential between the first central terminal and each of the first and second microelectronic elements.

In an exemplary embodiment, the first and second leads can be usable to carry a shared timing signal between the first central terminal and the first and second microelectronic elements. In one embodiment, the first and second leads can be usable to carry at least a clock signal. In a particular embodiment, the microelectronic assembly can further include third and fourth leads electrically interconnecting a second central terminal of the central terminals with each of the first and second microelectronic elements. The first and second leads can be usable to carry a first differential clock signal. The third and fourth leads being usable to carry a second differential clock signal between the second central terminal and the first and second microelectronic elements. The first and second differential clock signals can collectively transmit a differential clock.

In a particular embodiment, the first and second leads can be usable to carry a data signal between the first central terminal and each of the first and second microelectronic elements. In one embodiment, each of the first and second microelectronic elements can have contacts usable for input or output of a plurality of data signals shared by the first and second microelectronic elements through a set of leads including the first and second leads to a set of shared terminals of the plurality of central terminals, the shared terminals including the first central terminal. In an exemplary embodiment, each of the first and second microelectronic elements can include a memory storage element and the first and second leads can be usable to carry an address signal usable to address the memories in each of the first and second microelectronic elements.

In one embodiment, the first surface of the dielectric element can have a first peripheral edge and a first peripheral region between the first aperture and the first edge. The microelectronic assembly can further include a third lead extending from a first terminal exposed at the first peripheral region to at least one of the contacts of the first microelectronic element. The third lead can be usable to carry a first data signal between the at least one first terminal and the first microelectronic element. In a particular embodiment, the first surface of the dielectric element can have a second peripheral edge and a second peripheral region between the second aperture and the second edge. The microelectronic assembly can further include a fourth lead extending from a second terminal exposed at the second peripheral region to at least one of the contacts of the first microelectronic element. The third lead can be usable to carry a second data signal between the second terminal and the second microelectronic element. In a particular embodiment, the first microelectronic element can have contacts usable for input or output of the first data signal and not usable for input or output of the second data signal. The second microelectronic element can have contacts usable for input or output of the second data signal and not usable for input or output of the first data signal.

In accordance with another aspect of the invention, a microelectronic assembly can include a dielectric element, a first microelectronic element, a second microelectronic element, a first signal lead, and a first reference lead. The dielectric element can have oppositely-facing first and second surfaces and at least one first aperture extending between the first and second surfaces, the dielectric element further having electrically conductive elements thereon including a plurality of terminals exposed at the first surface. The first microelectronic element can have a rear surface and a front surface facing the dielectric element, the first microelectronic element having a plurality of contacts exposed at the front surface thereof. The second microelectronic element can include a rear surface and a front surface facing the rear surface of the first microelectronic element, the second microelectronic element having a plurality of contacts exposed at the front surface thereof projecting beyond an edge of the first microelectronic element. The first signal lead can extend through the at least one aperture to a conductive element on the dielectric element and can be electrically connected between a first contact of the first microelectronic element and a first terminal of the dielectric element. A first reference lead can be connected to at least one conductive element on the dielectric element, a portion of the first reference lead being substantially parallel to and spaced a substantially uniform distance from a substantial portion of the first signal lead, such that a desired impedance can be achieved for the first signal lead. The first reference lead can be used to connect to a reference potential and can be electrically connected to at least one contact of the first microelectronic element.

In a particular embodiment, the first reference lead can extend across the first aperture of the dielectric element. In an exemplary embodiment, the microelectronic assembly can further include a second aperture extending through the dielectric element and a second signal lead extending through the second aperture to a conductive element on the dielectric element and electrically connected between a contact of the second microelectronic element and a terminal on the dielectric element. In one embodiment, the microelectronic element can further include a second reference lead electrically connected to conductive elements on the dielectric element, at least a portion the second reference lead spaced a substantially uniform distance from the second signal lead, such that a desired impedance can be achieved for the second signal lead. In a particular embodiment, the first reference lead can extend across the first and second apertures of the dielectric element. In an exemplary embodiment, a first portion of the first reference lead can extend at a substantially uniform distance from the first signal lead and the second portion of the first reference lead can extend at a substantially uniform distance from the second signal lead.

In accordance with yet another aspect of the invention, a microelectronic assembly can include a dielectric element, a first microelectronic element, a second microelectronic element, and first and second bond wires. The dielectric element can have oppositely-facing first and second surfaces and at least one aperture extending between the first and second surfaces, the dielectric element further having electrically conductive elements thereon including a plurality of contacts and a plurality of terminals, the contacts and terminals exposed at the first surface of the dielectric element. The first microelectronic element can have a rear surface and a front surface facing the dielectric element, the first microelectronic element having a plurality of contacts exposed at the front surface thereof. The second microelectronic element can have a rear surface and a front surface facing the rear surface of the first microelectronic element, the second microelectronic element having a plurality of contacts exposed at the front surface and projecting beyond an edge of the first microelectronic element. First and second bond wires can extend through the at least one aperture to conductive elements on the dielectric element, the first and second bond wires having first ends electrically connected to a first contact of the first microelectronic element and second ends electrically connected to a first terminal of the dielectric element and providing electrically parallel conductive paths.

In an exemplary embodiment, the first bond wire can be joined to a first one of the conductive elements and can be joined to an end of the second bond wire such that the first bond wire does not touch at least one of the first contact or the first conductive element. In one embodiment, the microelectronic assembly can further include third and fourth electrically conductive bond wires extending through the at least one aperture to conductive elements on the dielectric element. The third and fourth bond wires can be electrically connected between a first contact of the second microelectronic element and a second terminal of the dielectric element and can provide electrically parallel conductive paths. In a particular embodiment, the microelectronic assembly can further include at least one passive component mounted on the dielectric element.

In accordance with still another aspect of the invention, a microelectronic assembly can include a dielectric element, a first microelectronic element, a second microelectronic element, first leads, and second leads. The dielectric element can have oppositely-facing first and second surfaces and an aperture extending between the surfaces, the dielectric element further having conductive elements thereon. The first microelectronic element can have a rear surface and a front surface facing the dielectric element, the first microelectronic element having a first edge and a plurality of contacts exposed at the front surface thereof remote from the first edge. The second microelectronic element can have a rear surface and a front surface facing the rear surface of the first microelectronic element, the second microelectronic element having a plurality of contacts exposed at the front surface thereof and projecting beyond the first edge of the first microelectronic element, the aperture in the dielectric element encompassing the contacts of the first and second microelectronic elements. The first leads can extend from contacts of the first microelectronic element through the aperture to at least some of the conductive elements. The second leads can extend from contacts of the second microelectronic element through the aperture to at least some of the conductive elements.

In accordance with another aspect of the invention, a microelectronic assembly can include a dielectric element, a first microelectronic element, and a second microelectronic element. The dielectric element can have oppositely-facing first and second surfaces and an aperture extending between the surfaces. The first microelectronic element can have a rear surface, a front surface facing the dielectric element and a first edge, the first microelectronic element having a plurality of contacts exposed at the front surface thereof remote from the first edge and redistribution conductors extending along the front surface from the contacts to redistribution pads exposed at the front surface adjacent the first edge. The second microelectronic element can have a rear surface and a front surface, the second microelectronic element having a plurality of contacts exposed at the front surface thereof projecting beyond the first edge of the first microelectronic element. The redistribution pads of the first microelectronic element and the contacts of the second microelectronic element can be aligned with the aperture in the dielectric element.

In one embodiment, the dielectric element can have electrically conductive elements thereon including terminals exposed at the first surface of the dielectric element. The microelectronic assembly can further include first leads extending from the redistribution pads of the first microelectronic element through the aperture to some of the electrically conductive elements on the dielectric element, and second leads extending from the contacts of the second microelectronic element through the aperture to some of the electrically conductive elements on the dielectric element.

Further aspects of the invention provide systems which incorporate microelectronic structures according to the foregoing aspects of the invention, composite chips according to the foregoing aspects of the invention, or both in conjunction with other electronic devices. For example, the system may be disposed in a single housing, which may be a portable housing. Systems according to preferred embodiments in this aspect of the invention may be more compact than comparable conventional systems.

Further aspects of the invention provide modules that can include a plurality of microelectronic assemblies according to the foregoing aspects of the invention. Each module can have a common electrical interface for transport of signals to and from each of said microelectronic assemblies.

Further aspects of the invention provide arrangements which incorporate at least one microelectronic assembly according to the foregoing aspects of the invention and at least one third microelectronic element vertically stacked with said at least one microelectronic assembly and electrically interconnected therewith. Said third microelectronic element can have a function different from a function of the at least one microelectronic assembly.

BRIEF DESCRIPTION OF THE DRAWINGS

FIG. 11 is a diagrammatic sectional view of a stacked microelectronic arrangement according to a further embodiment of the present invention;

FIG. 12 is a diagrammatic sectional view of a stacked microelectronic arrangement according to a further embodiment of the present invention;

DETAILED DESCRIPTION

Figure 1:
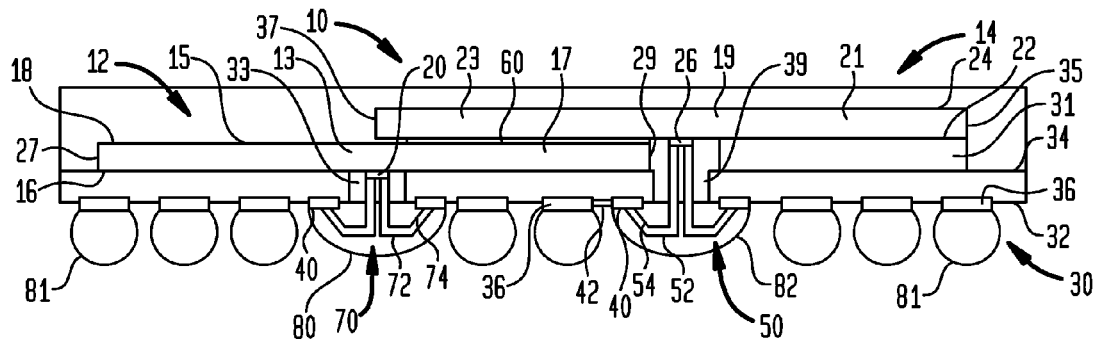
FIG. 1 is a diagrammatic sectional elevation view of a stacked microelectronic assembly according to an embodiment of the present invention.

With reference to FIG. 1, a stacked microelectronic assembly 10 according to an embodiment of the present invention includes a first microelectronic element 12 and a second microelectronic element 14. In some embodiments, the first and second microelectronic elements 12 and 14 may be a semiconductor chip, a wafer, or the like. For example, one or both of the first microelectronic element 12 and the second microelectronic element 14 can include a memory storage element. As used herein, a "memory storage element" refers to a multiplicity of memory cells arranged in an array, together with circuitry usable to store and retrieve data therefrom, such as for transport of the data over an electrical interface.

The first microelectronic element 12 has a front surface 16, a rear surface 18 remote therefrom, and first and second edges 27, 29, extending between the front and rear surfaces. The front surface 16 of the first microelectronic element 12 includes first and second end regions 15 and 17 and a central region 13 located between the first and second end regions 15 and 17. The first end region 15 extends between the central region 13 and first edge 27, and the second end region 17 extends between the central region 13 and the second edge 29. Electrical contacts 20 are exposed at the front surface 16 of the first microelectronic element 12. As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure may project from such surface; may be flush with such surface; or may be recessed relative to such surface and exposed through a hole or depression in the structure. The contacts 20 of the first microelectronic element 12 are exposed at the front surface 16 within the central region 13. For example, contacts 20 may be arranged in one or two parallel rows adjacent the center of first surface 16.

The second microelectronic element 14 has a front surface 22, a rear surface 24 remote therefrom, and first and second edges 35, 37, extending between the front and rear surfaces. The front surface 22 of the second microelectronic element 14 includes first and second end regions 21 and 23 and a central region 19 located between the first and second end regions 21 and 23. The first end region 21 extends between the central region 19 and first edge 35, and the second end region 23 extends between the central region 19 and the second edge 37. Electrical contacts 26 are exposed at the front surface 22 of the second microelectronic element 14. The contacts 26 of the second microelectronic element 14 are exposed at the front surface 22 within the central region 19. For example, contacts 26 may be arranged in one or two parallel rows adjacent the center of first surface 22.

As seen in FIG. 1, the first and second microelectronic elements 12 and 14 are stacked relative to each other. In some embodiments, the front surface 22 of the second microelectronic element 14 and the rear surface 18 of the first microelectronic element 12 face each other. At least a portion of the second end region 23 of the second microelectronic element 14 overlies at least a portion of the second end region 17 of the first microelectronic element 12. At least a portion of the central region 19 of the second microelectronic element 14 projects beyond the second edge 29 of the first microelectronic element 12. Accordingly, the contacts 26 of the second microelectronic element 14 are positioned in a location beyond the second edge 29 of the first microelectronic element 12.

The microelectronic assembly 10 further includes a dielectric element 30 having oppositely-facing first and second surfaces 32 and 34. While FIG. 1 shows only one dielectric element 30, the microelectronic assembly 10 may include more than one dielectric element. One or more electrically conductive elements or terminals 36 are exposed at the first surface 32 of the dielectric element 30. At least some terminals 36 may be movable with respect to the first and/or second microelectronic element 12 and 14.

The dielectric element 30 may further include one or more apertures. In the embodiment depicted in FIG. 1, the dielectric element 30 includes a first aperture 33 substantially aligned with the central region 13 of the first microelectronic element 12 and a second aperture 39 substantially aligned with the central region 19 of the second microelectronic element 14, thereby providing access to contacts 20 and 26.

As seen in FIG. 1, the dielectric element 30 may extend beyond the first edge 27 of the first microelectronic element 12 and the second edge 35 of the second microelectronic element 14. The second surface 34 of the dielectric element 30 may be juxtaposed with the front surface 16 of the first microelectronic element 12. The dielectric element 30 may be partly or entirely made of any suitable dielectric material. For example, the dielectric element 30 may comprise a layer of flexible material, such as a layer of polyimide, BT resin or other dielectric material of the commonly used for making tape automated bonding ("TAB") tapes. Alternatively, the dielectric element 30 may comprise a relatively rigid, board like material such as a thick layer of fiber-reinforced epoxy, such as, Fr-4 or Fr-5 board. Regardless of the material employed, the dielectric element 30 may include a single layer or multiple layers of dielectric material.

The dielectric element 30 may also include electrically conductive elements 40 exposed on the first surface 32 and electrically conductive traces 42. The electrically conductive traces 42 electrically couple the electrically conductive elements 40 to the terminals 36.

A spacing layer 31, such as an adhesive layer, may be positioned between the first end region 21 of the second microelectronic element 14 and a portion of the dielectric element 30. If spacing layer 31 includes adhesives, the adhesives connect the second microelectronic element 14 to the dielectric material 30. Another spacing layer 60 may be positioned between the second end region 23 of the second microelectronic element 14 and the second end region 17 of the first microelectronic element 12. This spacing layer 60 may include adhesive for bonding the first and second microelectronic elements 12 and 14 together. In such case, the spacing layer 60 may be partly or entirely made of a die-attach adhesive and may be comprised of a low elastic modulus material such as silicone elastomer. However, the spacing layer 60 may be entirely or partly made of a thin layer of high elastic modulus adhesive or solder if the two microelectronic elements 12 and 14 are conventional semiconductors chips formed of the same material, because the microelectronic elements will tend to expand and contract in unison in response to temperature changes. Irrespective of the materials employed, each of spacing layers 31 and 60 may include a single layer or multiple layers.

Figure 2:
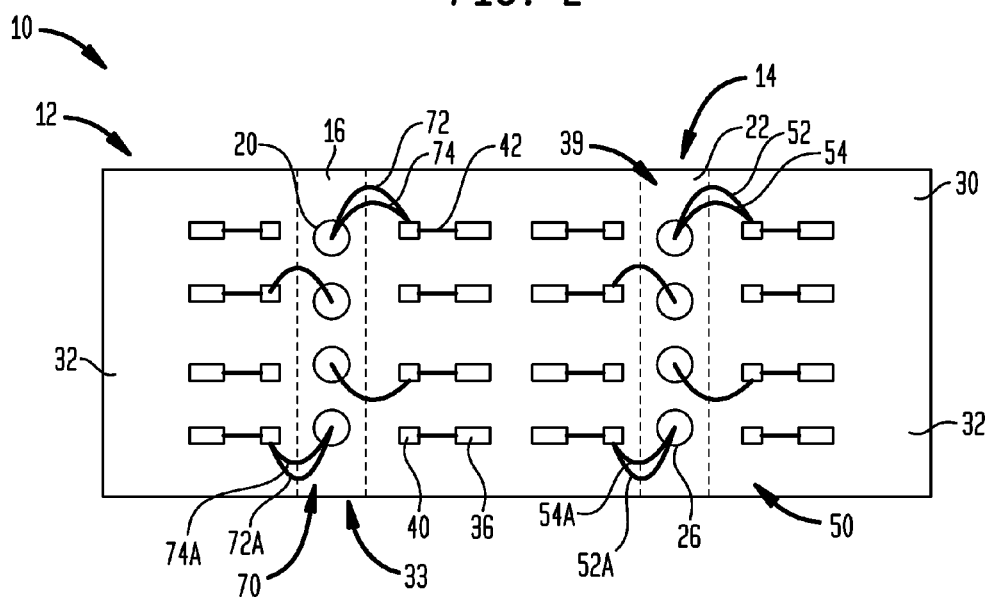
FIG. 2 is a bottom view of the stacked assembly of FIG. 1.

As seen in FIGS. 1 and 2, electrical connections or leads 70 electrically connect contacts 20 of the first microelectronic element 12 to some electrically conductive elements 40. Electrical connections 70 may include multiple wire bonds 72, 74. Wire bonds 72, 74 extend through the first aperture 33 and are oriented substantially parallel to each other. Each of the wire bonds 72 and 74 electrically couples a contact 20 to a corresponding element 40 of the dielectric element. A multiple wire bond structure according to this embodiment can substantially decrease inductance of a wire bond connection by providing an additional path for current to flow between the connected contacts. Such a multiple wire bond structure can provide electrically parallel conductive paths between a contact 20 and a corresponding element 40 of the dielectric element. As used herein, a "lead" is a portion of or the entire electrical connection extending between two electrically conductive elements, such as the lead comprising wire bonds 72, 74 and a trace 42 that extends from one of the contacts 20 of the first microelectronic element 12, through one of the electrically conductive elements 40, to one of the terminals 36.

Other electrical connections or leads 50 electrically couple contacts 26 of the second microelectronic element 14 to some elements 40. Electrical connections 50 may include multiple wire bonds 52, 54. Wire bonds 52, 54 extend through the second aperture 39 and are oriented substantially parallel to each other. Each of wire bonds 52 and 54 electrically couples a contact 26 to a corresponding element of the dielectric element 30. A multiple bond wire structure according to this embodiment can substantially decrease inductance of a wire bond connection by providing an additional path for current to flow between the connected contacts.

Figure 3:
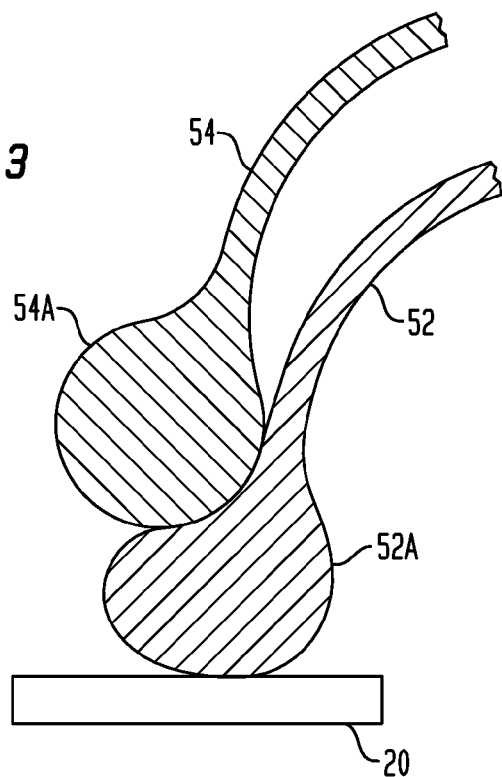
FIG. 3 is a fragmentary partial sectional view illustrating a connection between bond elements in a microelectronic assembly in an embodiment herein.

As seen in FIG. 3, in electrical connection 70, the first bond wire 52 can have an end 52A metallurgically joined with the chip contact 20 and another end (not shown) metallurgically joined with the electrically conductive elements 40. For example, the bond wires can include a metal such as gold which can be welded using ultrasonic energy, heat, or both, to a contact to form a metallurgical joint or bond therewith. In contrast, the second bond wire 54 can have one end 54A metallurgically bonded to the end 52A of the first bond wire 52 and an opposite end (not shown) metallurgically bonded to an end of the first bond wire 52.

The second bond wire 54 need not touch the electrically conductive elements 140, to which the first bond wire 52 is metallurgically bonded. Instead, in a particular embodiment, the ends 54A of the second bond wire 54 can be metallurgically bonded to the ends 52A of the first bond wire 52 in such way the that second bond wire does not touch the contact at at least one end of the second bond wire and may not touch the contacts at either end.

The ends 52A, 54A of each bond wire 52, 56 can include a ball formed during the wirebonding process. A wirebonding tool typically operates by advancing the tip of a gold wire from a spool to a tip of the tool. In one example of processing, when the tool is in position for forming a first wire bond at a first contact, e.g., chip contact 20, the tool can then apply ultrasonic energy, heat or both to the wire until the tip of the wire melts and forms a ball. The heated ball then metallurgically bonds with a surface of the contact. Then, when the tip of the wirebonding tool is moved away from the first contact, the ball remains bonded to the contact, while a length of the bond wire between such contact and a second contact is paid out. The wirebonding tool can then attach a second end of the wire to a second contact, forming a metallurgical joint with the second contact at that end.

The above process can then be repeated in a somewhat different fashion to form the second bond wire. In this case, the wirebonding tool can be moved into a position, and can then be used to heat the tip of the wire to form a ball which then metallurgically joins an end 54A of the second bond wire to the end 52A of the first bond wire. The wirebonding tool can then attach the other end of the second bond wire to a second end of the first bond wire, forming a metallurgical joint with at least the first bond wire at that end.

Some of the electrically conductive elements 40 can carry signals, i.e., voltages or currents which vary with time and which typically convey information. For example, without limitation, voltages or currents which vary with time and which represent state, change, a measurement, a clock or timing input or a control or feedback input are examples of signals. Others of the electrically conductive elements 40 may provide connections to ground or a power supply voltage. A connection to ground or a power supply voltage typically provides a voltage which is at least fairly stable with time over frequencies of interest to the operation of the circuit. Dual or multiple wire bond connections between respective pairs of contacts may be especially beneficial when the connections are to ground or a power supply voltage. In one example, the dual wire connections 72, 74 and 52, 54 can connect the respective microelectronic elements 12,14 to ground terminals on dielectric element 30. Similarly, the dual wire bond connections 72A, 74A and 52A, 54A can connect the respective microelectronic elements to power supply terminals on the dielectric element (for further interconnection to a power supply through a circuit panel, not shown). Increasing the number of wire bonds in these connections to ground or power terminals can reduce inductance in the ground and power circuits, which can help reduce noise in the system.

Another possible benefit of a multiple bond wire structure and method according to this embodiment is to reduce inductance when area for attaching a bond wire to a contact such as a bond pad on a chip or a substrate is limited. Some chips have particularly high contact density and fine pitch. The bond pads on such chips have very limited area. A structure in which a second bond wire has an end attached to an end of a first bond wire but which itself does not touch the contact can achieve a dual or multiple bond wire structure without requiring the size of the bond pad to be increased. Thus, a multiple bond wire structure as described with respect to FIG. 3 may be achieved even when forming wire bond connections to contacts which are arranged at a fine pitch or contacts which have small area.

Moreover, some microelectronic elements having high density also have high input and output rates, i.e., high frequencies at which signals are transmitted onto or off of the chip. At sufficiently high frequencies, the inductance of a connection can increase substantially. A multiple bond wire structure according to this embodiment can substantially decrease inductance of a wire bond connection used for ground, power or signal transmission by providing an additional path for current to flow between the connected contacts.

Figure 4:
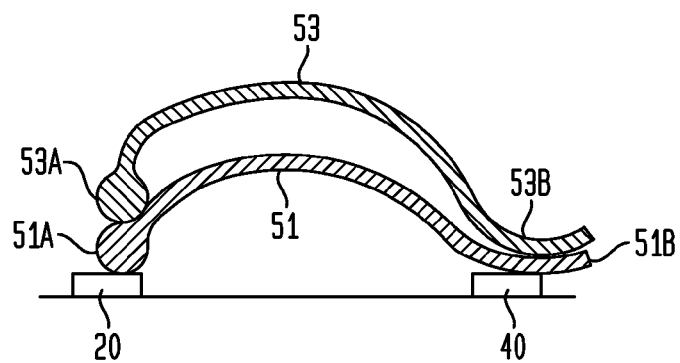
FIG. 4 is a fragmentary partial sectional view further illustrating a connection between bond elements in a microelectronic assembly in an embodiment herein.

FIG. 4 illustrates connections between a first bond wire 51 and a second bond wire 53 at ends thereof. As seen in FIG. 4, at first ends of the bond wires, the balls 51A and 53A can be metallurgically joined together, but in such manner that the ball of the second wire 53 does not touch the contact 20. At second ends 51B, 53B of the bond wires at a second contact 40, electrical connection can be made between the wires without balls being formed at the second ends 51B, 53B. In this case, one of the contacts 20, 40 can be a chip contact exposed at a surface of the chip, and another one of the contacts 20, 40 can be a substrate contact exposed at a surface of the substrate. As further seen in FIG. 4, the second end 53B of the second wire bond is joined to the first bond wire at 51B without the second bond wire touching the contact 40.

Figure 5:
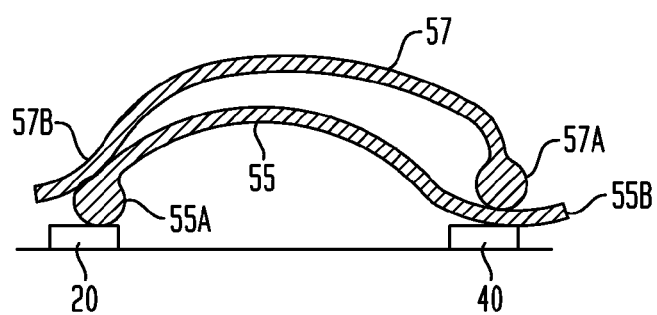
FIG. 5 is a fragmentary partial sectional view illustrating a connection between bond elements in a variation of a microelectronic assembly in an embodiment herein.

FIG. 5 illustrates a variation of such embodiment (FIG. 4) in which, the first bond wire 55 has a ball end 55A joined to a first contact 20. A wire end 57B of the second bond wire 57 is metallurgically joined to the ball end 55A of the first bond wire above the first contact 20. In addition, a ball end 57A of the second bond wire 57 is metallurgically joined to a wire end 55B of the first bond wire 55 at the second contact 40.

In another variation of the above-described embodiments, a plurality of bond wires can be formed and joined with an existing bond wire, already joined to the contacts at ends thereof, to form three or more parallel paths between the contacts. In this embodiment, a third bond wire can be arranged such that the joints between it and first or second bond wires (e.g., wires 51, 53 (FIG. 4) or wires 55, 57 (FIG. 5) do not touch the contacts to which ends of the first bond wire are joined. If desired, an even greater number of bond wires can be used which are metallurgically joined in this manner to other bond wires, so as to provide parallel electrical paths for current to flow between a pair of contacts.

Figure 6:
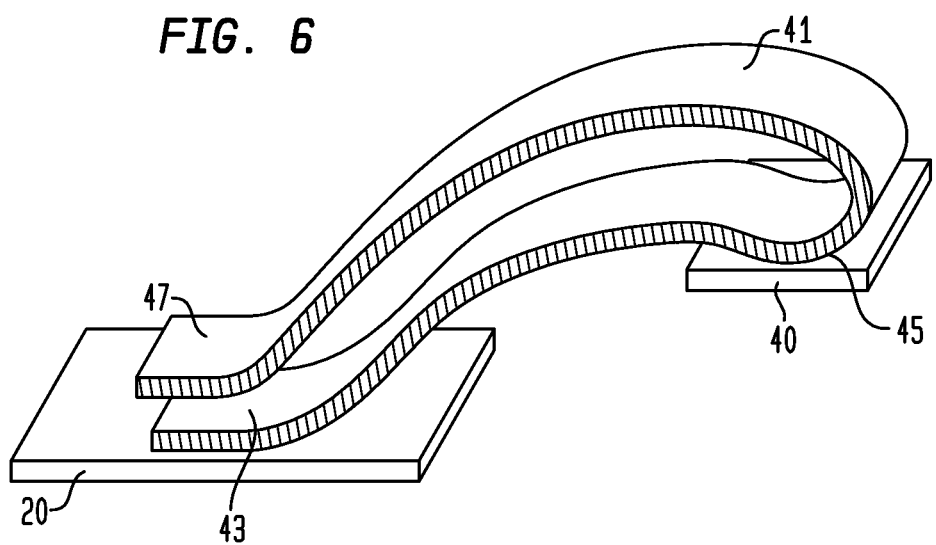
FIG. 6 is a fragmentary partial perspective view of a microelectronic assembly particularly illustrating a looped connection including a ribbon bond therein.

FIG. 6 illustrates an electrical connection in which a bond ribbon 41 is used instead of a bond wire, wherein the bond ribbon 41 has a first end 43 metallurgically joined to one of the contacts (e.g., contact 20). The bond wire 41 has a middle portion 45 which is metallurgically joined to another contact 40, and has a second end 47 joined to the first end 43 of the bond ribbon. The joint between the first and second ends 43, 47 of the bond ribbon can be such that the second end 47 does not touch the contact 20 to which the first end is joined. Alternatively, in one variation (not shown), the second end 47 can touch or be joined directly with the same contact 20 to which the first end 43 is joined. One of the contacts, e.g., one of contacts 20, 40 can be a substrate contact and another one of the contacts 20, 40 can be a chip contact. Alternatively, both of the contacts 20, 40 can be substrate contacts exposed at a surface of a substrate, or both contacts 20, 40 can be chip contacts exposed at a surface of a chip.

The microelectronic assembly 10 (FIG. 1) may also include a first encapsulant 80 and a second encapsulant 82. The first encapsulant 80 covers electrical connections 70 and the first aperture 33 of the dielectric element 30. The second encapsulant 82 covers electrical connections 70 and the second aperture 39 of the dielectric element 30.

The microelectronic assembly 10 can further include a plurality of joining units, such as solder balls 81. Solder balls 81 are attached to terminals 36 and are therefore electrically interconnected to at least some of the elements 40, leads 50 and 70 and contacts 20 and 26.

Figure 7:
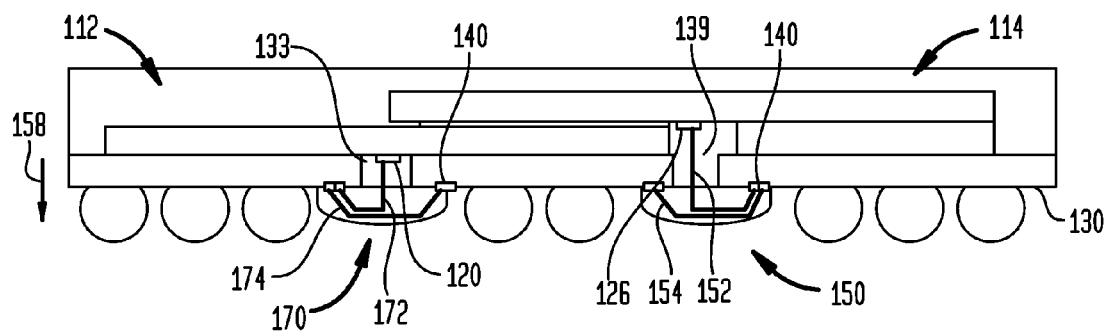
FIG. 7 is a diagrammatic sectional elevation view of a stacked microelectronic assembly according to another embodiment of the present invention.

FIG. 7 shows a variation of the embodiment described above. In this variation, the electrical connectors 170 include a first wire bond 172 electrically connecting the contact 120 of the first microelectronic element 112 to a corresponding electrically conductive element 140 and a second wire bond 174 electrically interconnecting two electrically conductive elements 140 of the dielectric element 130. The second wire bond 174 extends across the first aperture 133 of the dielectric element 130. The second wire bond 174 can be positioned at a uniform distance from a substantial portion of the length of the first wire bond 172. One of the wire bonds 172, 174 can connect to contacts of the microelectronic element and the substrate used to carry a signal onto or off of the chip or both. The other of the wire bonds 172, 174 can connect to contacts of the microelectronic element and substrate used to connect to a reference potential such as ground or a power supply or other reference potential. In one embodiment, the substantial portion of the length can be at least a one millimeter length or can be 25% of a total length of such wire bond 172. Similarly, the electrical connections 150 can include a first wire bond 152 electrically connecting the contact 126 of the second microelectronic element 114 to a corresponding electrically conductive element 140 and a second wire bond 154 interconnecting two electrically conductive elements 140 of the dielectric element 130. The second wire bond 154 may extend across the second aperture 139 of the dielectric element 130. The second wire bond 154 can be positioned at a uniform distance from a portion of the first wire bond 152 i.e., an at least one millimeter length or greater, or at least 25% of the total length of an individual wire bond 152. A multiple bond wire structure according to this embodiment can assist in a achieving a desired controlled impedance for signals carried by the wire bonds 172, 152. Thus, for example, in one example, the wire bonds 172, 174 can be formed using wire of a standard diameter such as 25 microns and with the substantial portion of wire bond 172 spaced from and parallel to wire bond 174 by a distance from 30 to 70 microns to achieve a characteristic impedance of about 50 ohms. In a particular embodiment, wire bonds 172 174 can be spaced apart in a direction that includes at least a vertical component relative to the substrate. That is, the separation between these substantially parallel portions of the wire bonds 172, 174 is at least partly in a vertical direction 158 normal to the front surface of the microelectronic element 112, so that either one of the wire bonds 172, 174 is at a greater height from that front surface of microelectronic 112 than the other one of the wire bonds 172, 174. Wire bonds 152, 154 which are provided at aperture 139 adjacent the microelectronic element 114, can be arranged in a similar manner to wire bonds 172, 174.

Figure 8:
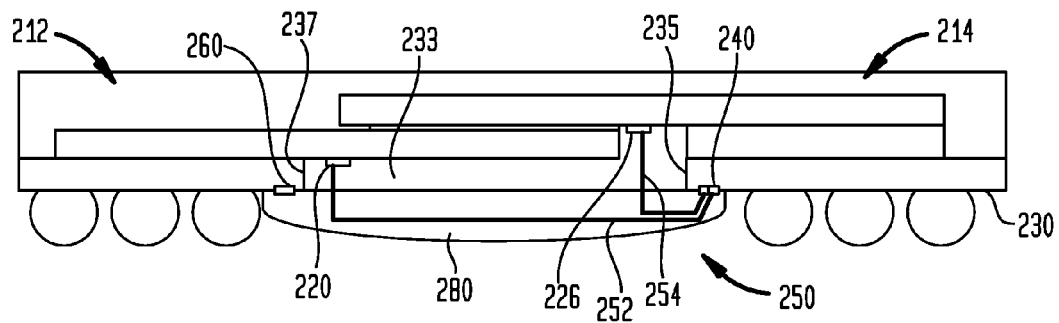
FIG. 8 a diagrammatic sectional elevation view of a stacked microelectronic assembly according to yet another embodiment of the present invention.

FIG. 8 shows a variation of the embodiment depicted in FIG. 7. In this variation, the dielectric element 230 includes a single aperture 233 substantially aligned with both the contacts 220 of the first microelectronic element 212 and the contacts 226 of the second microelectronic element 214, such that wire bonds 252, 254 connected to contacts 220, 226 or both microelectronic elements 212, 214 extend through the same aperture 233. For example, this variation includes a first wire bond 252 connecting the contact 220 of the first microelectronic element 212 to an electrically conductive element 240 of the dielectric element 230 beyond a first edge 235 of the aperture 233. A second wire bond 254 can also connect the contact 226 of the second microelectronic element 214 to an electrically conductive element 240 beyond the first edge 235 of the aperture 233. Although not shown, other wire bonds can electrically connect respective contacts 220 and contacts 226 of the first and second microelectronic elements with contacts 260 of the dielectric element which are disposed beyond a second edge 237 of the aperture. An encapsulant 280 covers and protects the electrical connection 250 and the entire aperture 233.

Figure 9:
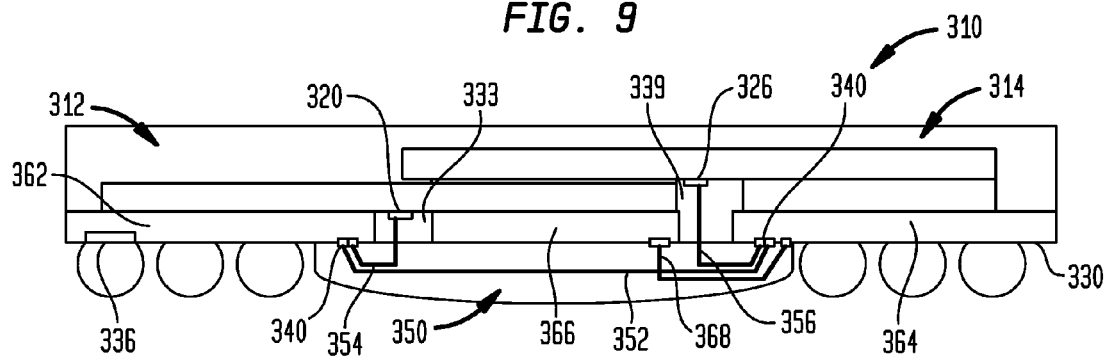
FIG. 9 is a diagrammatic sectional elevation view of a stacked microelectronic assembly according to a further embodiment of the present invention.

FIG. 9 shows a variation of the embodiment depicted in FIG. 8. In this variation, the dielectric element 330 has a first aperture 333 substantially aligned with the contacts 320 of the first microelectronic element 312 and a second aperture 339 substantially aligned with the contacts 326 of the second microelectronic element 314. The encapsulant 380 covers both the first and second apertures 333 and 339 of the dielectric element 330. A reference wire bond 352 may electrically connect an electrically conductive element 340 adjacent to the first aperture 333 with another electrically conductive element 340 adjacent the second aperture 339. One or more of the conductive elements 340 may further be adapted for interconnection with a reference potential such as a ground or power input through one more terminals 336 of the assembly 310. The reference wire bond 352 may extend across both the first aperture 333 and the second aperture 339. In the example shown in FIG. 9, the electrical connection 350 can further include a first signal wire bond 354 and a second signal wire bond 356. The first signal wire bond 354 extends through first aperture 333 and electrically connects a contact 320 of the first microelectronic element 312 to another electrically conductive element 340 adjacent to the first aperture 333. The second signal wire bond 356 extends through the second aperture 339 and electrically connects a contact 326 of the second microelectronic element 314 to another electrically conductive element 340 of the dielectric element 330 adjacent the second aperture 339. The reference wire bonds can be spaced from at least substantial portions of respective wire bonds 354, 356, as described above, in order to permit a desired characteristic impedance to be achieved. An encapsulant 380 covers and protects the reference bond wire 352, the first signal wire bond 354, the second wire bond 256 and the first and second apertures 333 and 339.

One or more reference wire bonds 352 can assist in maintaining stable ground or power supply voltages between first and second end portions 362, 364 of dielectric element. In a variation thereof, one or more reference wire bonds 368 can electrically connect respective contacts on central and second portions 364, 366 of the dielectric element 330.

Figure 10:
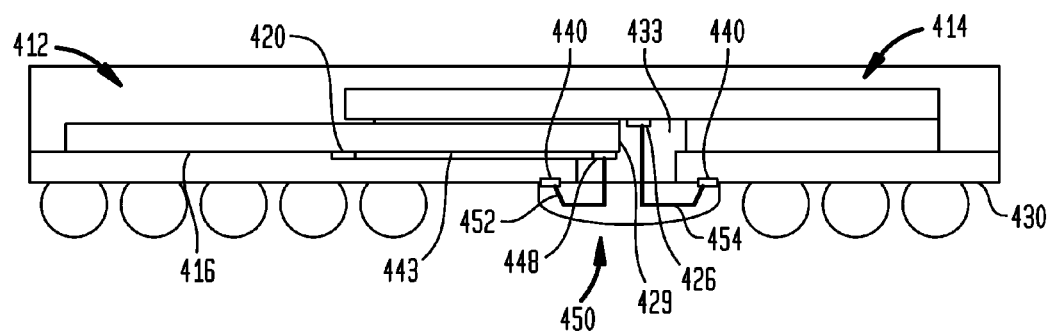
FIG. 10 is a diagrammatic sectional elevation view of a stacked microelectronic assembly according to another embodiment of the present invention.

FIG. 10 is a variation of the embodiment described in FIG. 1. In this variation, the dielectric element 430 includes a single aperture 433 substantially aligned with the contacts 426 of the second microelectronic element 414 and an edge 429 of the first microelectronic element 412. The first microelectronic element 412 includes a redistribution layer 443 connecting respective contacts 420 in the central region with electrically conductive elements 448 (e.g., redistribution pads) positioned adjacent the edge 429.

For example, a plurality of electrically conductive traces or redistribution conductors 442 can be formed on the first surface 416 of the first microelectronic element 412, such as by plating onto the surface 416, etching a metal layer bonded or laminated to the surface 416, or a combination of plating and etching steps. Such redistribution conductors 442 can extend along the first surface 416 from contacts 420 to respective redistribution pads or electrically conductive elements 448 exposed at the first surface adjacent the edge 429. Such redistribution pads or electrically conductive elements 448 can be aligned with the aperture 433.

As seen in FIG. 10, a first wire bond 452 connects the element 448 adjacent the edge 429 of the first microelectronic element 412 with an electrically conductive element 440 of the dielectric element 430. The first wire bond 452 extends through the aperture 433. A second wire bond 454 connects a contact 426 of the second microelectronic element 414 with an electrically conductive element 440. The second wire bond 454 extends through the aperture 433 of the dielectric element 430. One or more contacts 426 of the second microelectronic element 414 can be aligned with the aperture 433 in the dielectric element 430.

FIG. 11 depicts an arrangement 1000 including at least two stacked and electrically interconnected microelectronic assemblies 900. Microelectronic assemblies 900 may be any of the assemblies described above. Joining units 981, e.g., solder balls, may be exposed at a surface of at least one of the microelectronic assemblies for electrically connecting the arrangement to a circuit panel, for example. The two microelectronic assemblies 900 are electrically connected to each other through any suitable electrical connector. For example, the assemblies can be electrically interconnected via solder columns 990 which are joined to pads (not shown) on the dielectric elements 930A, 930B of the respective microelectronic elements. In a particular embodiment also shown in FIG. 11, electrically conductive posts 992 and solder 994 can be used to electrically interconnect the two microelectronic assemblies 900A and 900B. Posts 992 may extend either from the first assembly or from the second assembly towards the other, or posts provided on both assemblies may extend towards each other, and in some cases, can be part of the same vertical column connecting the two assemblies.

FIG. 12 depicts an arrangement 1010 including a third microelectronic element 940 vertically stacked and electrically interconnected with at least one microelectronic assembly 900B having a first microelectronic element 912 and a second microelectronic element 914. The microelectronic assembly 900B may be any of the assemblies described above. The arrangement 1010 is similar to the arrangement 1000 shown in FIG. 11, except that the microelectronic assembly 900B is stacked with a microelectronic element 940. Joining units 941, e.g., solder balls, may be exposed at a surface of the third microelectronic element 940 for electrically connecting the third microelectronic element to a dielectric element 930A, for example. The third microelectronic element 940 can be electrically connected with the microelectronic assembly 900B through any suitable electrical connector, such as solder columns 990 and/or electrically conductive posts 992 and solder 994.

The third microelectronic element 940 can have a function different from a function of the at least one microelectronic assembly 900B. For example, one or both of the first microelectronic element 912 and the second microelectronic element 914 can each include a memory storage element, and the third microelectronic element 940 can have a logic function. For example, the third microelectronic element can include a logic functional unit as a primary or substantial functional element therein. In a particular example, the logic functional element can be a processor, which can be a general purpose or special purpose processor. For example, the processor can include that which may be referred to variously as a microprocessor, central processing unit, co-processor, or special purpose processor such as a graphics processor, among others. In one example, when the third microelectronic element 940 includes a processor, the third microelectronic element can be arranged to operate in conjunction with at least one memory storage element in one or more of the microelectronic elements within the microelectronic assembly 900B. In this way, the processor can store data to the memory storage element through signals transported between the processor and the memory storage element in microelectronic assembly 900B. For example, the signals can be transported from the processor within microelectronic element 940 to a memory storage element within assembly 900B via the above-described electrical connections including solder bumps 941 and conductive elements such as leads (not shown) extending along the dielectric elements 930A to solder columns 990 or posts 992 connected thereto. From the solder columns 990 or posts 992, signals can be transported along leads of the microelectronic assembly 900B to at least one of the first or second microelectronic elements 912, 914.

Figure 13:
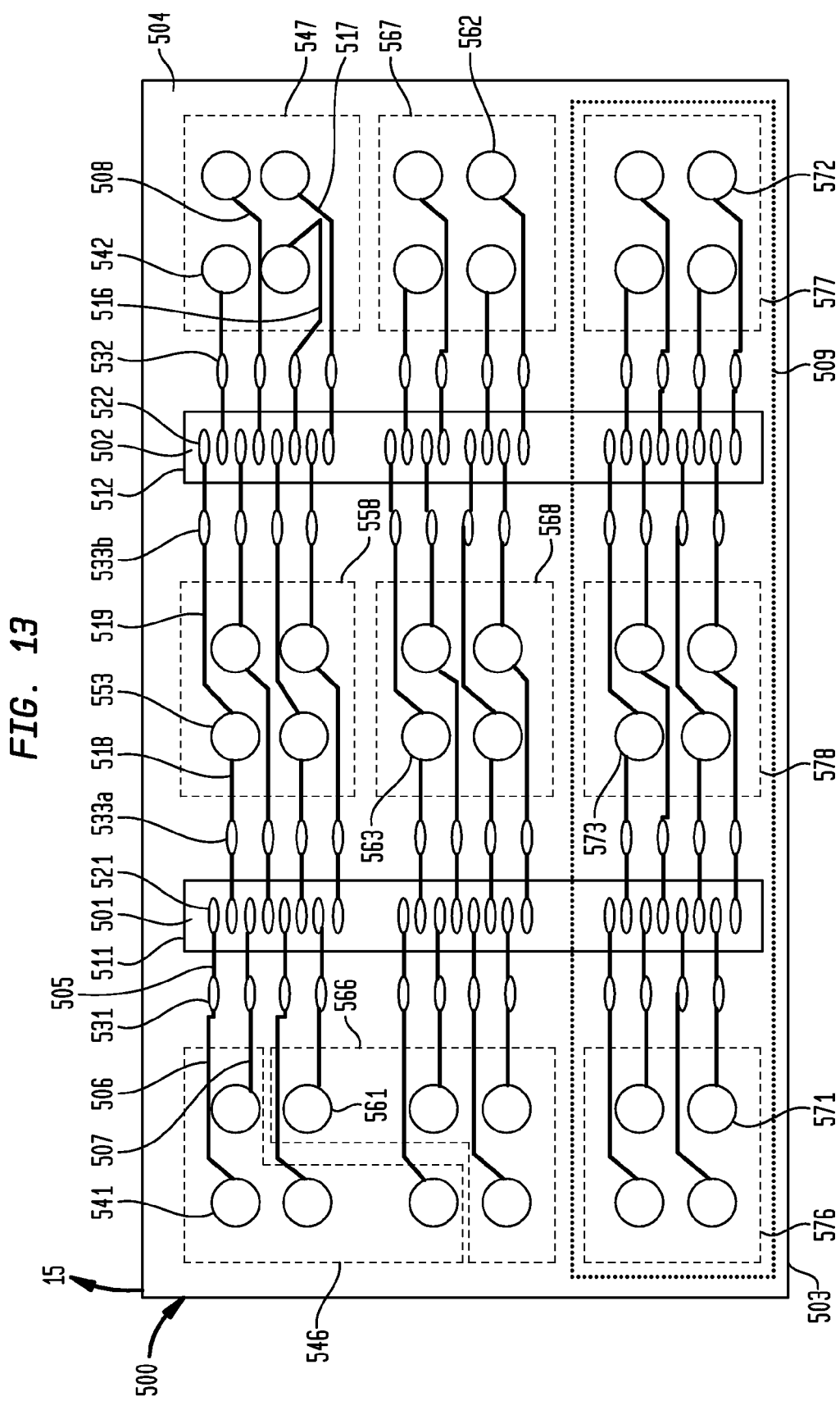
FIG. 13 is a diagrammatic bottom view of a stacked microelectronic assembly according to yet another embodiment of the present invention.

Referring now to FIG. 13, a stacked microelectronic assembly 500 according to an embodiment of the present invention includes a first half word-width microelectronic element 501 and a second half word-width microelectronic element 502. The first microelectronic element 501 and the second microelectronic element 502 can be arranged in a similar stacked configuration as that shown in any of FIG. 1, 7, or 11 as described above, whereby at least a portion of the second microelectronic element overlies the first microelectronic element, and both microelectronic elements overlie a dielectric element 503.

The dielectric element 503 includes a first aperture 511 substantially aligned with a contact-bearing region of a front surface of the first microelectronic element 501, thereby providing access to the electrical contacts 521 exposed thereat. The dielectric element 503 further includes a second aperture 512 substantially aligned with a contact-bearing region of a front surface of the second microelectronic element 502, thereby providing access to electrical contacts 522 exposed thereat. The contact-bearing regions can be disposed in central regions of each microelectronic element, as described above (FIG. 1). The apertures 511 and 512 can be filled with encapsulants, as described above with reference to FIGS. 1-7.

The dielectric element 503 can have electrically conductive elements 531 and 533a exposed at a surface 504 thereof that can be electrically coupled to the electrical contacts 521 of the first microelectronic element 501, for example, by lead portions such as wire bonds 505, lead bonds, or other means. The dielectric element 503 can further include electrically conductive elements 532 and 533b exposed at the surface 504 that can be electrically coupled to the electrical contacts 522 of the second microelectronic element 502, for example, by lead portions such as wire bonds 505, lead bonds, or other means. The lead portions 505 can couple the electrical contacts 521 to the electrically conductive elements 531 and 533a and can couple the electrical contacts 522 to the electrically conductive elements 532 and 533b in any of the configurations described above with respect to the embodiments described in FIGS. 1-11.

The dielectric element 503 can further have electrically conductive terminals 541, 561, and 571 exposed at the surface 504 thereof overlying the first microelectronic element 501. These terminals can be electrically coupled to the electrical contacts 521 of the first microelectronic element 501. The terminals 541, 561, and 571 can be arranged in respective terminal groups 546, 566, and 576. Data input/output signals can be transmitted between the first microelectronic element 501 and a circuit panel 702 or other component (FIG. 17) through the terminals 541 in the group 546, for example. Electrical connections to one or more power supply voltages, reference voltage, or other reference potential, e.g., ground, can be made through the terminals 561 in the group 566. In a particular example, a first reference potential terminal 561 can be electrically connected to a first reference potential signal, for example, on a circuit panel 702 or other component (FIG. 17), and a second reference potential terminal 561 can be electrically connected to a second separate reference potential signal on the circuit panel or other component. Address signals between the first microelectronic element 501 and an external device can be transmitted through the terminals 571 in the group 576. The terminals 541, 561, and 571 in each of the groups 546, 566, or 576 can be electrically coupled only to the first microelectronic element 501 but not to the second microelectronic element 502, and one or more of such terminals can alternatively be connected to both microelectronic elements.

The dielectric element 503 can further have electrically conductive terminals 542, 562, and 572 exposed at the surface 504 thereof overlying the second microelectronic element 502. These terminals can be electrically coupled to the electrical contacts 522 of the second microelectronic element 502. The terminals 542, 562, and 572 can be arranged in respective terminal groups 547, 567, and 577. Data input/output signals can be transmitted between the second microelectronic element 502 and a circuit panel 702 or other component (FIG. 17) through the terminals 542 in the group 547, for example. Electrical connections to one or more power supply voltages, reference voltage, or other reference potential, e.g., ground, can be made through the terminals 562 in the group 567. Address signals between the second microelectronic element 502 and an external device can be transmitted through the terminals 572 in the group 577. The terminals 542, 562, and 572 in each of the groups 547, 567, or 577 can be electrically coupled only to the second microelectronic element 502 but not to the first microelectronic element 501, and one or more of such terminals can alternatively be connected to both microelectronic elements.

The dielectric element 503 can have electrically conductive elements or terminals 553, 563, and 573 exposed at the surface 504 thereof and overlying at least portions of the first and second microelectronic elements, although the first microelectronic element can be disposed between the dielectric element and the second microelectronic element. Each of the terminals 553, 563, and 573 can be electrically coupled to both the electrical contacts 521 of the first microelectronic element 501 and the electrical contacts 522 of the second microelectronic element 502. The terminals 553, 563, and 573 can be arranged in respective terminal groups 558, 568, and 578. For example, shared clock signals, shared data strobe signals, or other shared signals can be transmitted between an external device and the microelectronic elements 501 and 502 through particular terminals 553 in the group 558. Shared electrical connections to one or more power supply voltages, reference voltage, or other reference potential, e.g., ground, can be made through the terminals 563 in the group 568. Shared address signals between the first and second microelectronic elements and an external device can be transmitted through the terminals 573 in the group 578. The terminals 553, 563, and 573 in each of the groups 558, 568, or 578 can be electrically connected to either one or both of the first microelectronic element 501 and the second microelectronic element 502.

Although each of the terminal groups 546, 547, 558, 566, 567, 568, 576, 577, and 578 are shown in FIG. 13 to comprise four adjacent respective terminals 541, 542, 553, 561, 562, 563, 571, 572, and 573, in other embodiments, each terminal group can comprise any number of terminals arranged in any geometric configuration, and the terminals comprising any particular group need not be adjacent one another. Moreover, the terminals in two or more groups can overlap or be interspersed with each other. For example, the terminals 541 in the group 546 are interspersed with the terminals 561 in the group 566.

Figure 17:
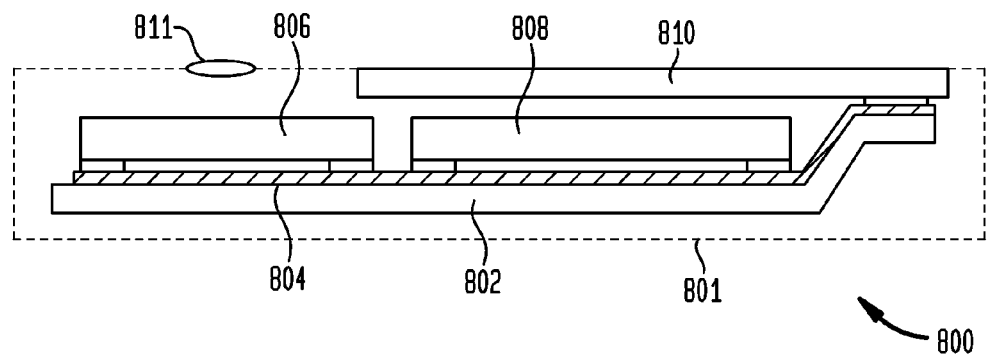
FIG. 17 is a schematic depiction of a system according to one embodiment of the invention.

In a preferred embodiment, the terminals 553, 563, and 573 that are located between the first aperture 511 and the second aperture 512 are shared terminals that are electrically coupled to both microelectronic elements 501 and 502. However, one or more of the terminals 553, 563, and 573 can be electrically coupled only to a single one of the microelectronic elements 501 or 502, depending on the desired characteristics of the stacked microelectronic assembly 500. Similarly, in a preferred embodiment, the terminals 541, 561, and 571 that are located to the left of the first aperture 511 are electrically coupled only to the first microelectronic element 501, and the terminals 542, 562, and 572 that are located to the right of the second aperture 512 are electrically coupled only to the second microelectronic element 502. However, when further connected to a circuit panel or other component, as in an assembly or system as further described in FIG. 17, one or more of the terminals 561, 562, 571, and 572 can be electrically coupled to both microelectronic elements 501 and 502, for example, through electrical connections in a circuit panel 702 or other component (FIG. 17).

The dielectric element 503 can further have a ground plane or power plane 509 below the surface 504 thereof or disposed on or exposed at a second surface 34 (FIG. 1). Such plane 509 can underlie one or more of the address signal terminals 571, 572, and 573. Such a plane 509 can reduce noise in the signals passing through the terminals 571, 572, and 573 and/or can allow the stacked microelectronic assembly 500 to meet one or more applicable standards, e.g., a JEDEC standard. Although the plane 509 is shown in FIG. 13 as a single element extending across the entire dielectric element 503, in other embodiments, the plane 509 may be discrete ground plane or power plane segments. For example, the plane 509 may include a discrete plane segment underlying each of the terminal groups 576, 577, and 578, with gaps between the plane segments at the locations of the apertures 511 and 512. Although the stacked microelectronic assembly 500 is shown as having a ground plane or power plane 509, such a ground plane or power plane is optional, and, in a particular embodiment, can be omitted from the stacked microelectronic assembly.

A possible benefit of a stacked microelectronic assembly 500 whereby the first or second microelectronic element 501 or 502 overlies at least a portion of the other of the first or second microelectronic elements is to provide relatively short traces 506 electrically connecting a particular terminal (e.g., the terminal 541) at the surface 504 of the dielectric element 503 to a particular electrical contact (e.g., the electrical contact 521) exposed at a front surface of a particular microelectronic element (e.g., the first microelectronic element 501). Parasitic capacitance can be considerable between adjacent traces such as traces 506 and 507, particularly in microelectronic assemblies that have high contact density and fine pitch. In microelectronic assemblies such as the stacked microelectronic assembly 500 where traces are relatively short, parasitic capacitance can be reduced, particularly between adjacent traces such as traces 506 and 507.

Another possible benefit of a stacked microelectronic assembly 500 whereby the first or second microelectronic element 501 or 502 overlies at least a portion of the other of the first or second microelectronic elements is to provide similar lengths of traces 506 and 508, for example, that electrically connect data input/output signal terminals (e.g., the respective terminals 541 and 542) at the surface 504 of the dielectric element 503 with electrical contacts 531, 532 that, in turn, are electrically connected with respective electrical contacts 521 and 522 at the front surfaces of respective first and second microelectronic elements. In microelectronic assemblies such as the stacked microelectronic assembly 500 that can include half word-width microelectronic elements 501 and 502, having relatively similar-length traces 506 and 508 can allow the propagation delay for data input/output signals between each microelectronic element and the respective terminals 541 and 542 to be relatively closely matched. Furthermore, similar lengths of traces 516 and 517 can be provided, for example, that electrically connect adjacent data input/output signal terminals 542 with respective electrical contacts 532 that, in turn, are electrically connected with respective electrical contacts 522.

Yet another possible benefit of a stacked microelectronic assembly 500 whereby the first or second microelectronic element 501 or 502 overlies at least a portion of the other of the first or second microelectronic elements is to provide similar lengths of traces 518 and 519 that electrically connect shared clock signal terminals 553 and/or shared data strobe signal terminals 553 to contacts 533*a*, 533*b* that, in turn, are electrically connected with the respective microelectronic elements. The data strobe signal terminals 553 or the clock signal terminals 553 or both may have substantially the same loading and electrical path lengths to the respective microelectronic elements 501 and 502 and the path lengths to each microelectronic element can be relatively short.

Figure 14:
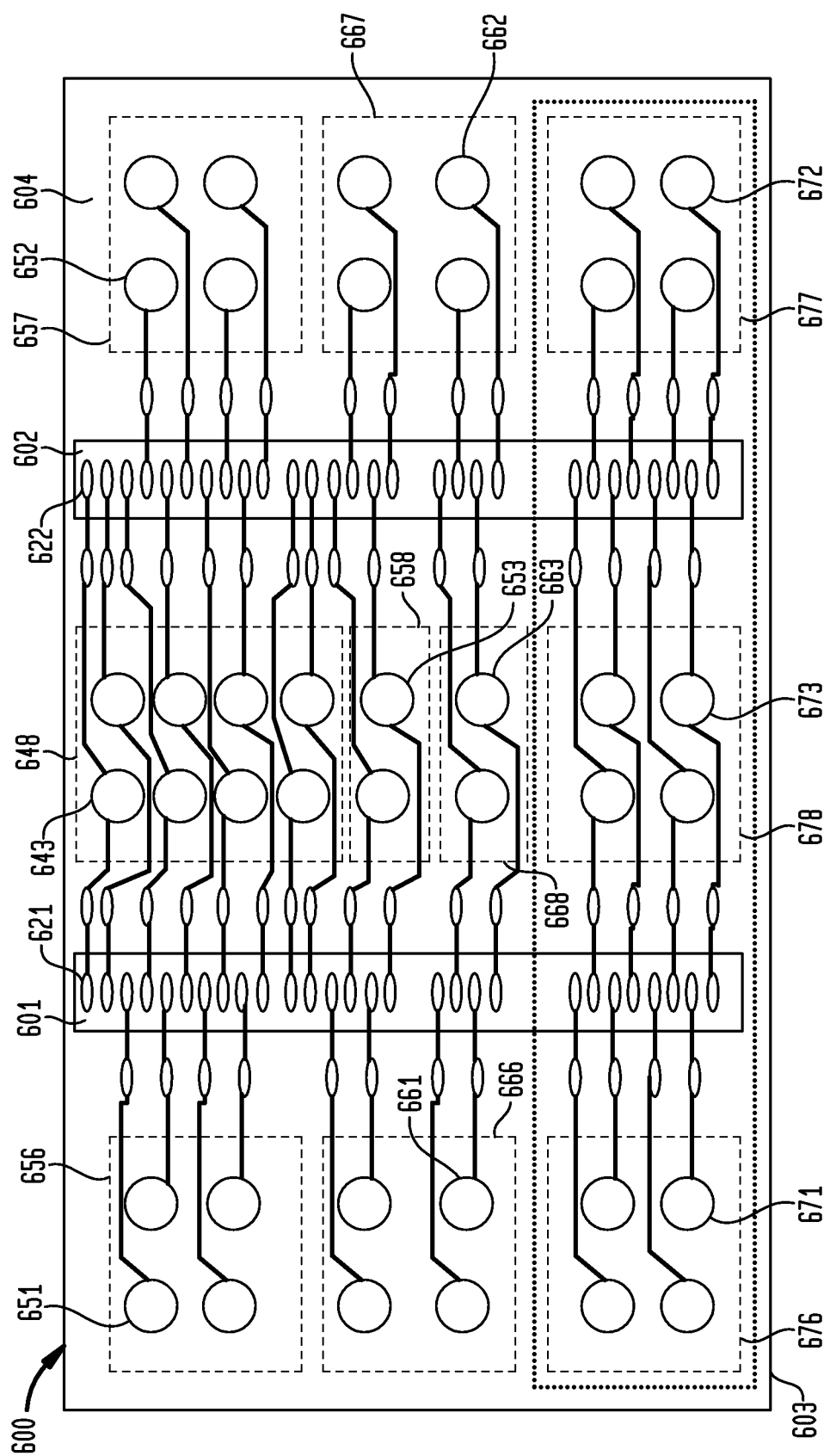
FIG. 14 is a diagrammatic bottom view of a stacked microelectronic assembly according to another embodiment of the present invention.

Referring now to FIG. 14, a stacked microelectronic assembly 600 according to an embodiment of the present invention includes a first full word-width microelectronic element 601 and a second full word-width microelectronic element 602. The microelectronic assembly 600 is similar to the stacked microelectronic assembly 500 shown in FIG. 13, except that rather than having half word-width microelectronic elements each electrically connected to separate data input/output signal terminals, the microelectronic assembly 600 may have full word-width microelectronic elements each of which can be connected to the same shared data input/output signal terminals.

At least a portion of the second microelectronic element 602 overlies the first microelectronic element 601, and both microelectronic elements overlie a dielectric element 603. The dielectric element 603 can have electrically conductive terminals 651, 661, and 671 exposed at the surface 604 thereof overlying the first microelectronic element 601. These terminals can be electrically coupled to the electrical contacts 621 of the first microelectronic element 601. The terminals 651, 661, and 671 can be arranged in respective terminal groups 656, 666, and 676. For example, clock signals, data strobe signals, or other signals can be transmitted between an external device and the first microelectronic element 601 through particular terminals 651 in the group 656. Electrical connections to one or more power supply voltages, reference voltage, or other reference potential, e.g., ground, can be made through the terminals 661 in the group 666. Address signals between the first microelectronic element 601 and an external device can be transmitted through the terminals 671 in the group 676.

The dielectric element 603 can further have electrically conductive elements or terminals 652, 662, and 672 exposed at the surface 604 thereof overlying the second microelectronic element 602. These terminals can be electrically coupled to the electrical contacts 622 of the second microelectronic element 602. The terminals 652, 662, and 672 can be arranged in respective terminal groups 657, 667, and 677. For example, clock signals, data strobe signals, or other signals can be transmitted between an external device and the second microelectronic element 602 through particular terminals 652 in the group 657. Electrical connections to one or more power supply voltages, a reference voltage or other reference potential, e.g., ground, can be made through the terminals 662 in the group 667. Address signals between the second microelectronic element 602 and an external device can be transmitted through the terminals 672 in the group 677.

The dielectric element 603 can have electrically conductive elements or terminals 643, 653, 663, and 673 exposed at the surface 604 thereof and overlying at least portions of the first and second microelectronic elements, although the first microelectronic element can be disposed between the dielectric element and the second microelectronic element. Some or all of the terminals 643, 653, 663, and 673 can be electrically coupled to the electrical contacts 621 of the first microelectronic element 601 and the electrical contacts 622 of the second microelectronic element 602. The terminals 643, 653, 663, and 673 can be arranged in respective terminal groups 648, 658, 668, and 678. Shared data input/output signals can be transmitted between the microelectronic elements 601 and 602 and a circuit panel 702 or other component (FIG. 17) through the terminals 643 in the group 648, for example. Shared clock signals, shared data strobe signals, or other shared signals can be transmitted between an external device and the microelectronic elements 601 and 602 through particular terminals 653 in the group 658. Shared electrical connections to one or more power supply voltages, a reference voltage or other reference potential, e.g., ground, can be made through the terminals 663 in the group 668. Shared address signals between the first and second microelectronic elements and an external device can be transmitted through the terminals 673 in the group 678.

Figure 15:
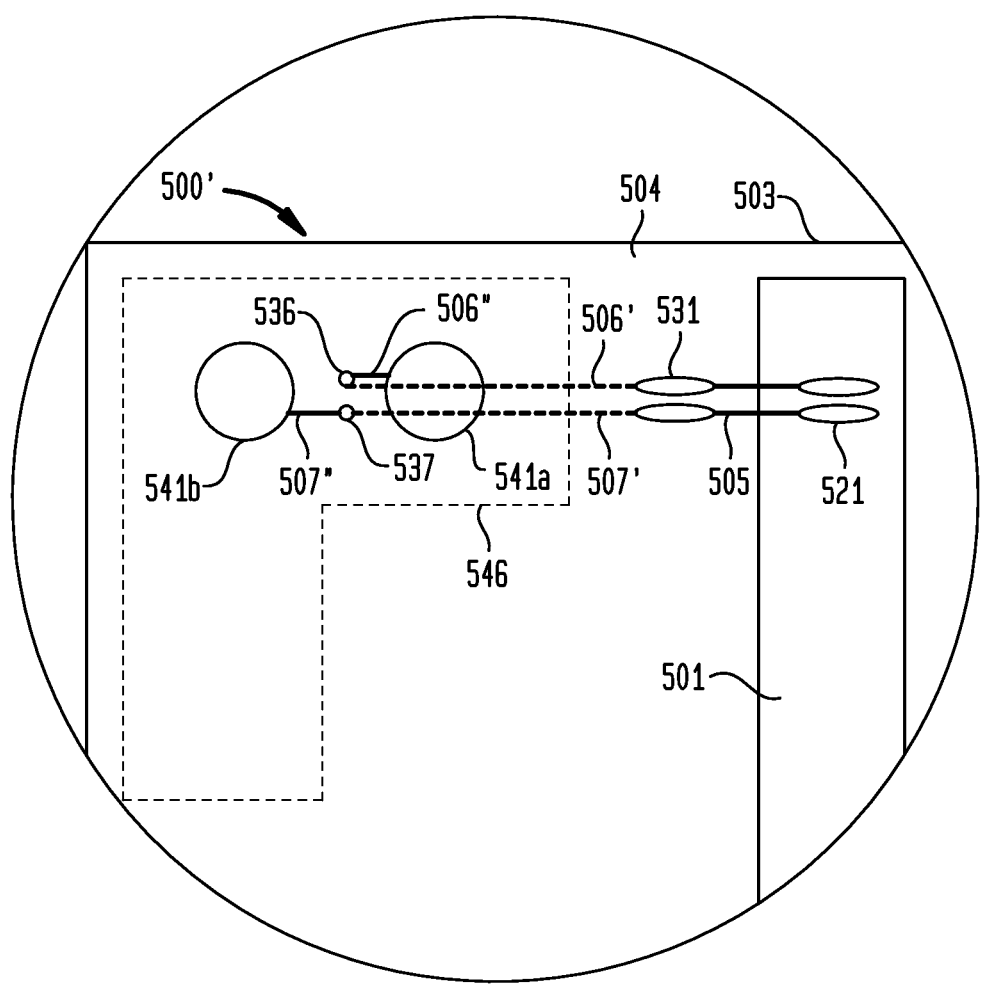
FIG. 15 is a diagrammatic enlarged view of a portion of FIG. 13 having an alternate trace routing arrangement.

Referring now to FIG. 15, a stacked microelectronic assembly 500' is similar to the stacked microelectronic assembly 500 shown in FIG. 13, except that an alternate trace routing arrangement is shown electrically coupling electrical contacts 521 of the first microelectronic element 501 to electrically conductive terminals 541*a* and 541*b* arranged in the terminal group 546. FIG. 15 is an enlarged view of a portion of FIG. 13, at the location indicated by the reference number 14 shown in FIG. 13. In FIG. 13, traces 506 and 507 that electrically couple terminals 541 at the surface 504 of the dielectric element 503 to respective electrical contacts 521 are shown as having unequal lengths. FIG. 15 shows alternate leads that electrically couple terminals 541*a* and 541*b* to respective electrical contacts 521 that have equal lengths.

The dielectric layer 503' can be a two metal layer substrate, whereby traces can be routed in two substantially parallel planes along a surface 504 thereof and along a second layer, such as the second surface 34 shown in FIG. 1. Such a second layer or surface can underlie the terminals 541a and 541b, such that traces 506' and 507' can extend underneath the terminal 541a without directly contacting the terminal 541a.

The traces 506' and 507' can be electrically coupled to respective electrical contacts 521 through different lead routing alternatives. In a particular embodiment, the electrically conductive elements 531, coupled to respective wire bonds 505, can be electrically connected to traces 506' and 507' on a second surface through electrically conductive vias, which may underlie the conductive elements 531. In one example, the traces 506' and 507' can be electrically coupled to the conductive elements 531 through separate conductive vias extending between the surface 504 and the second layer (not shown). In another embodiment, the electrically conductive elements 531 can be exposed at the second layer (e.g., the second surface 34), and the wire bonds 505 can extend directly between the conductive elements 531 and respective electrical contacts 521.

As shown in FIG. 15, the trace 506' can be electrically coupled to the terminal 541a through a conductive via 536 extending between the surface 504 and the second layer and then through a trace 506" extending between the conductive via 536 and the terminal 541a. The trace 507' can be electrically coupled to the terminal 541b through a conductive via 537 extending between the surface 504 and the second layer and then through a trace 507" extending between the conductive via 537 and the terminal 541b. The total lead length between the terminals 541a and 541b and the respective electrical contacts 521 can be the same by forming the conductive vias 536 and 537 half-way between the terminals 541a and 541b, such that the traces 506' and 507' can be of equal length and the traces 506" and 507" can be of equal length.

Figure 16:
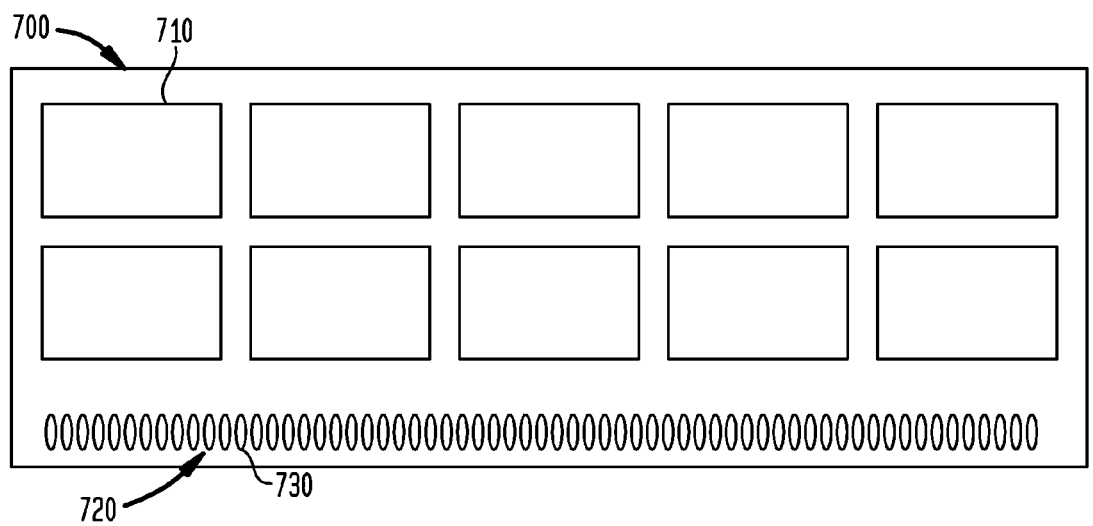
FIG. 16 is a schematic depiction of a module according to one embodiment of the invention.

FIG. 16 depicts a module 700 including at least two microelectronic assemblies 710 arranged together in one unit having an electrical interface 720 for transport of signals to and from each of the microelectronic assemblies 710. The electrical interface can include one or more contacts usable for transport of signals or reference potentials, e.g., power and ground, which are common to each of the microelectronic elements therein. The microelectronic assemblies 710 may be any of the assemblies described above. In a particular example, the module 700 can be a dual in-line memory module ("DIMM") or single in-line memory module ("SIMM") having one or more portions thereof sized for insertion into a corresponding slot of other connector of a system, such as can be provided on a motherboard. In such DIMM or SIMM, the electrical interface can have contacts 730 that are suitable for mating with a plurality of corresponding spring contacts within such slot connector. Such spring contacts can be disposed on single or multiple sides of each slot to mate with corresponding module contacts. Various other modules and interconnection arrangements are possible in which a module may have unstacked or stacked (e.g., FIG. 11, FIG. 12) microelectronic assemblies, or which may have parallel or serial electrical interfaces, or a combination of parallel and serial electrical interfaces for transport of electrical signals to and from the module. Any kind of electrical interconnection arrangement between the module 700 and a further system interface is contemplated by the invention.

In any or all of the microelectronic assemblies described in the foregoing, the rear surface of one or more of the first or second microelectronic elements can be at least partially exposed at an exterior surface of the microelectronic assembly after completing fabrication. Thus, in the assembly described above with respect to FIG. 1, one or both of the rear surfaces 18, 24 of the first or second microelectronic elements 12, 14 can be partially or fully exposed in the completed assembly. The rear surfaces can be partially or fully exposed although an overmold or other encapsulating or packaging structure can contact or be disposed adjacent the microelectronic elements.

In any of the embodiments described above, the microelectronic assembly may include a heat spreader made of metal, graphite or any other suitable thermally conductive material. In one embodiment, the heat spreader includes a metallic layer disposed adjacent to the first microelectronic element. The metallic layer may be exposed on the rear surface of the first microelectronic element. Alternatively, the heat spreader includes an overmold or an encapsulant covering at least the rear surface of the first microelectronic element.

The microelectronic assemblies described above can be utilized in construction of diverse electronic systems, as shown in FIG. 17. For example, a system 800 in accordance with a further embodiment of the invention includes a microelectronic assembly 806 as described above in conjunction with other electronic components 808 and 810. In the example depicted, component 808 is a semiconductor chip whereas component 810 is a display screen, but any other components can be used. Of course, although only two additional components are depicted in FIG. 17 for clarity of illustration, the system may include any number of such components. The microelectronic assembly 806 may be any of the assemblies described above. In a further variant, any number of such microelectronic assemblies may be used.

Microelectronic assembly 806 and components 808 and 810 are mounted in a common housing 801, schematically depicted in broken lines, and are electrically interconnected with one another as necessary to form the desired circuit. In the exemplary system shown, the system includes a circuit panel 802 such as a flexible printed circuit board, and the circuit panel includes numerous conductors 804, of which only one is depicted in FIG. 17, interconnecting the components with one another. However, this is merely exemplary; any suitable structure for making electrical connections can be used.

The housing 801 is depicted as a portable housing of the type usable, for example, in a cellular telephone or personal digital assistant, and screen 810 is exposed at the surface of the housing. Where structure 806 includes a light-sensitive element such as an imaging chip, a lens 811 or other optical device also may be provided for routing light to the structure. Again, the simplified system shown in FIG. 17 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic assembly, comprising: a dielectric element having a first surface, a second surface, first and second apertures extending between the first and second surfaces and defining a central region of the first surface between the first and second apertures, the first surface of the dielectric element having a first peripheral edge and a first peripheral region between the first aperture and the first edge, the dielectric element further having electrically conductive elements thereon including central terminals exposed at the central region and peripheral terminals exposed at the peripheral region; a first microelectronic element having a rear surface and a front surface facing the second surface of the dielectric element, the first microelectronic element having a plurality of contacts exposed at the front surface thereof; a second microelectronic element having a front surface facing the rear surface of the first microelectronic element, the second microelectronic element having a plurality of contacts exposed at the front surface thereof projecting beyond an edge of the first microelectronic element, each of the first and second microelectronic elements including a memory storage element; leads extending from the contacts of the first and second microelectronic elements to the central and peripheral terminals, at least first and second leads thereof electrically interconnecting a first central terminal of the central terminals with each of the first and second microelectronic elements, wherein the first and second leads are usable to carry at least one of a signal or a reference potential between the first central terminal and each of the first and second microelectronic elements, and the first and second leads are usable to carry an address signal usable to address memory storage elements in each of the first and second microelectronic elements; and a third lead electrically interconnecting a first peripheral terminal of the peripheral terminals with at least one of the contacts of the first microelectronic element, the third lead usable to carry a first data signal between the first peripheral terminal and the first microelectronic element.

2. The microelectronic assembly as claimed in claim 1, wherein the first and second leads are usable to carry a shared timing signal between the first central terminal and the first and second microelectronic elements.

3. The microelectronic assembly as claimed in claim 2, wherein the first and second leads are usable to carry at least a clock signal.

4. The microelectronic assembly as claimed in claim 3, further comprising third and fourth leads electrically interconnecting a second central terminal of the central terminals with each of the first and second microelectronic elements, wherein the first and second leads are usable to carry a first differential clock signal, the third and fourth leads being usable to carry a second differential clock signal between the second central terminal and the first and second microelectronic elements, wherein the first and second differential clock signals collectively transmit a differential clock.

5. The microelectronic assembly as claimed in claim 1, wherein the first and second leads are usable to carry a data signal between the first central terminal and each of the first and second microelectronic elements.

6. The microelectronic assembly as claimed in claim 5, wherein each of the first and second microelectronic elements has contacts usable for input or output of a plurality of data signals shared by the first and second microelectronic elements through a set of leads including the first and second leads to a set of shared terminals of the plurality of central terminals, the shared terminals including the first central terminal.

7. The microelectronic assembly as claimed in claim 1, wherein the first surface of the dielectric element has a second peripheral edge and a second peripheral region between the second aperture and the second edge, further comprising a fourth lead extending from a second peripheral terminal exposed at the second peripheral region to at least one of the contacts of the second microelectronic element, the fourth lead usable to carry a second data signal between the second terminal and the second microelectronic element.

8. The microelectronic assembly as claimed in claim 7, wherein the first microelectronic element has contacts usable for input or output of the first data signal and not usable for input or output of the second data signal, and the second microelectronic element has contacts usable for input or output of the second data signal and not usable for input or output of the first data signal.

9. A system comprising the microelectronic assembly according to claim 1, and one or more other electronic components electrically connected to the microelectronic assembly.

10. A system as claimed in claim 9, further comprising a housing, said microelectronic assembly and said other electronic components being mounted to said housing.

11. A module including a plurality of microelectronic assemblies according to claim 1, the module having a common electrical interface for transport of signals to and from each of said microelectronic assemblies.

12. An arrangement including at least one microelectronic assembly according to claim 1, and at least one third microelectronic element vertically stacked with said at least one microelectronic assembly and electrically interconnected therewith, said third microelectronic element having a function different from a function of the at least one microelectronic assembly.

* * * * *